United States Patent
Tsuji

(10) Patent No.: US 7,407,837 B2
(45) Date of Patent: Aug. 5, 2008

(54) METHOD OF MANUFACTURING SILICON CARBIDE SEMICONDUCTOR DEVICE

(75) Inventor: Takashi Tsuji, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 172 days.

(21) Appl. No.: 11/042,809

(22) Filed: Jan. 25, 2005

(65) Prior Publication Data
US 2005/0181536 A1 Aug. 18, 2005

(30) Foreign Application Priority Data
Jan. 27, 2004 (JP) ............... 2004-018675

(51) Int. Cl.
*H01L 21/332* (2006.01)
(52) U.S. Cl. .................. 438/137; 438/931; 257/77; 257/E21.054
(58) Field of Classification Search ................ 438/137, 438/931; 257/77
See application file for complete search history.

(56) References Cited
U.S. PATENT DOCUMENTS
5,763,905 A * 6/1998 Harris ................ 257/77

FOREIGN PATENT DOCUMENTS

| JP | 8-111528 A | 4/1996 |
|---|---|---|
| JP | 2000-22137 A | 1/2000 |
| JP | 2000150875 | * 5/2000 |
| JP | 2002-222950 A | 8/2002 |

OTHER PUBLICATIONS

Roosevelt People, Physics and Application of Ge$_x$ Si$_{1-x}$/Si Strained-Layer Heterostructures, IEEE Journal of Quantum Electronics, Sep. 9, 1986, pp. 1696-1710, vol. QE-22.

* cited by examiner

*Primary Examiner*—Bradley W. Baumeister
*Assistant Examiner*—Matthew L Reames
(74) *Attorney, Agent, or Firm*—Rossi, Kimms & McDowell LLP

(57) ABSTRACT

Stress is exerted to the SiC crystal in the region, in which the carriers of a SiC semiconductor device flow, to change the crystal lattice intervals of the SiC crystal. Since the degeneration of the conduction bands in the bottoms thereof is dissolved, since the inter-band scattering is prevented from causing, and since the effective electron mass is reduced due to the crystal lattice interval change, the carrier mobility in the SiC crystal is improved, the resistance of the SiC crystal is reduced and, therefore, the on-resistance of the SiC semiconductor device is reduced.

4 Claims, 16 Drawing Sheets

FIG. 1
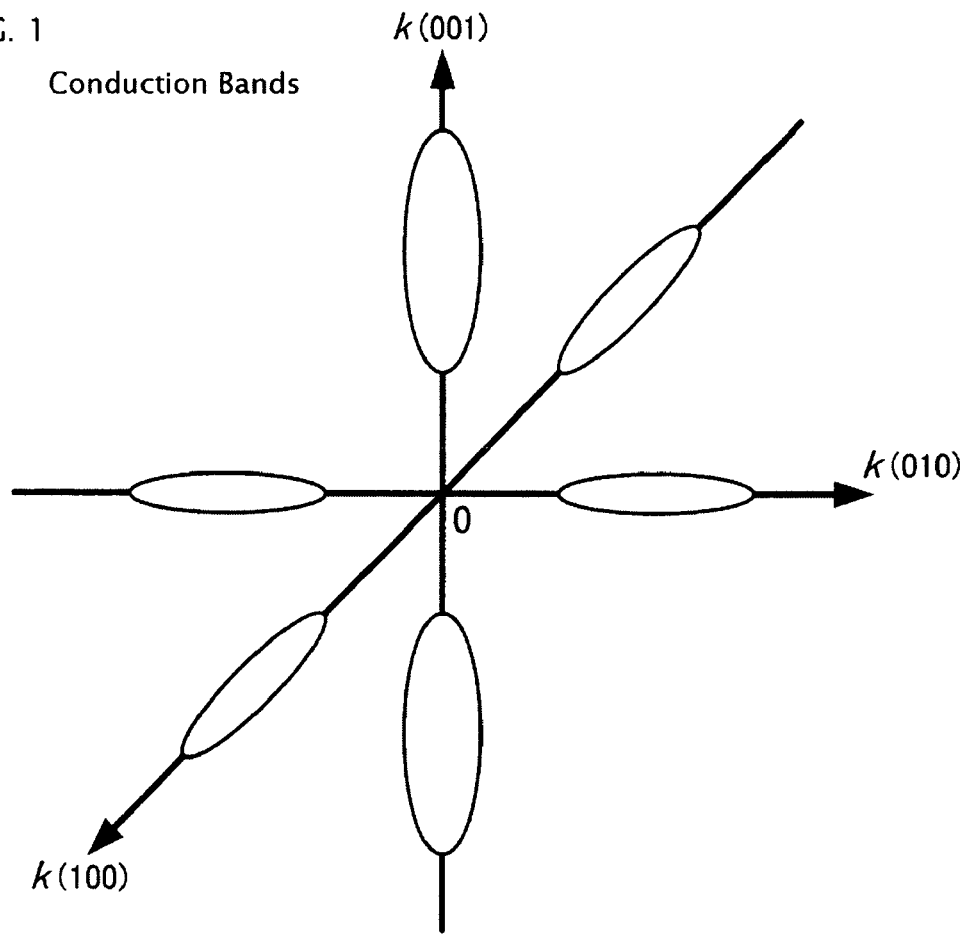
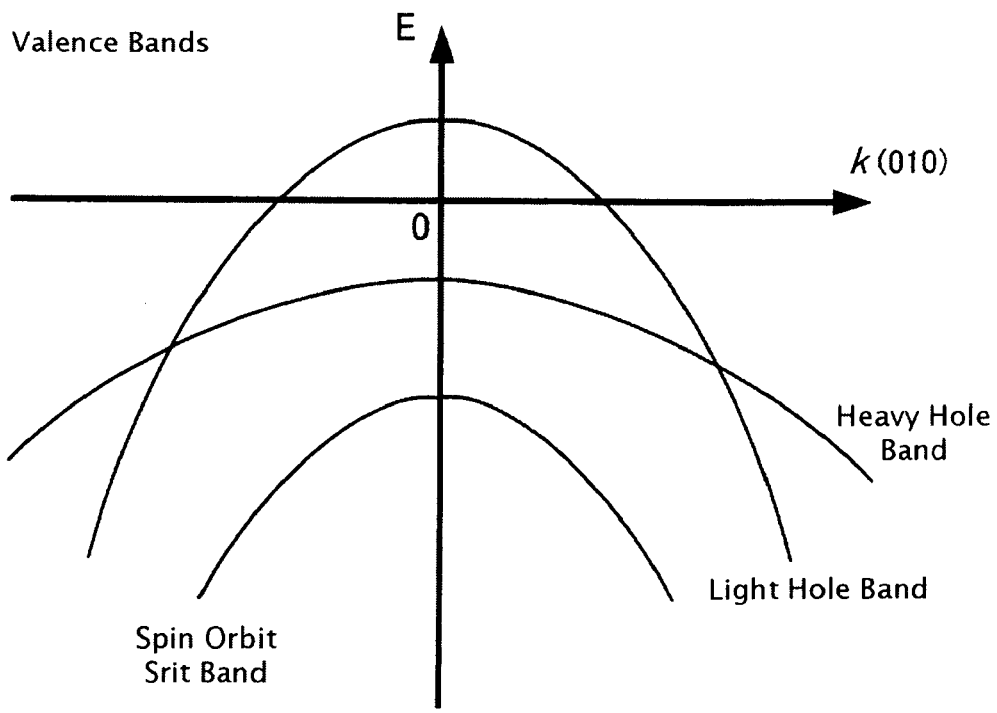

FIG. 2
Conduction Bands
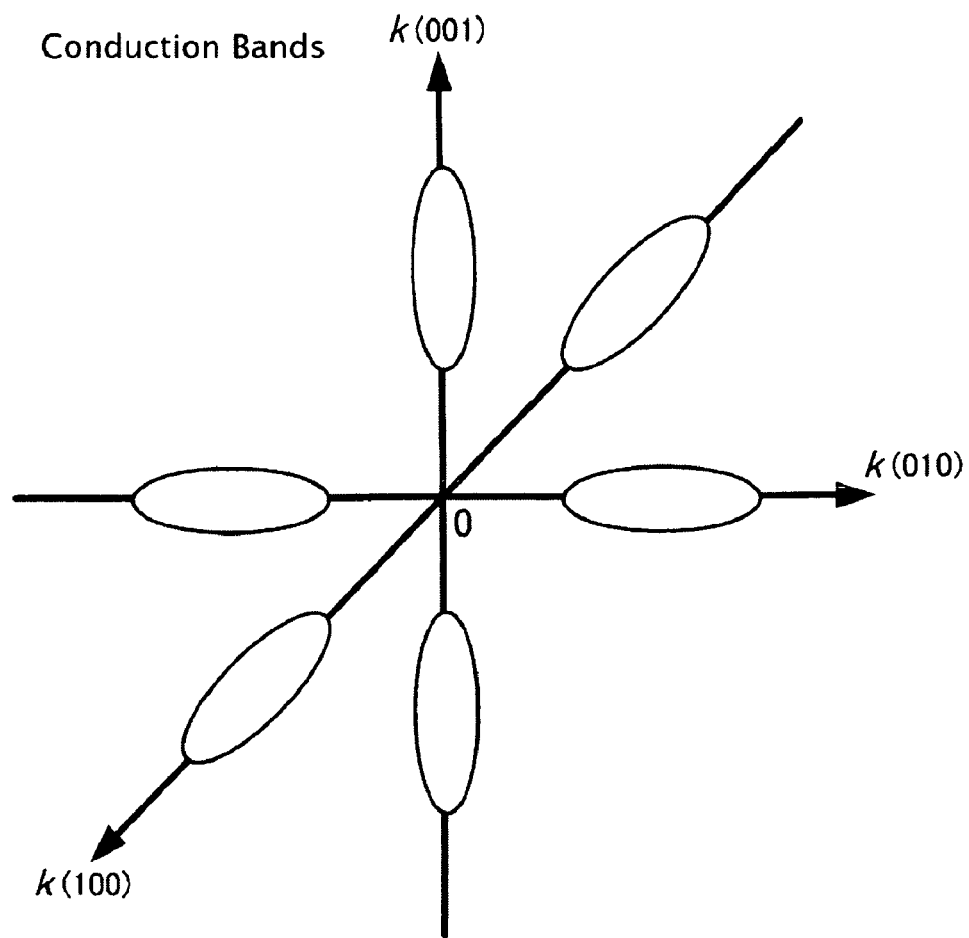
Valence Bands
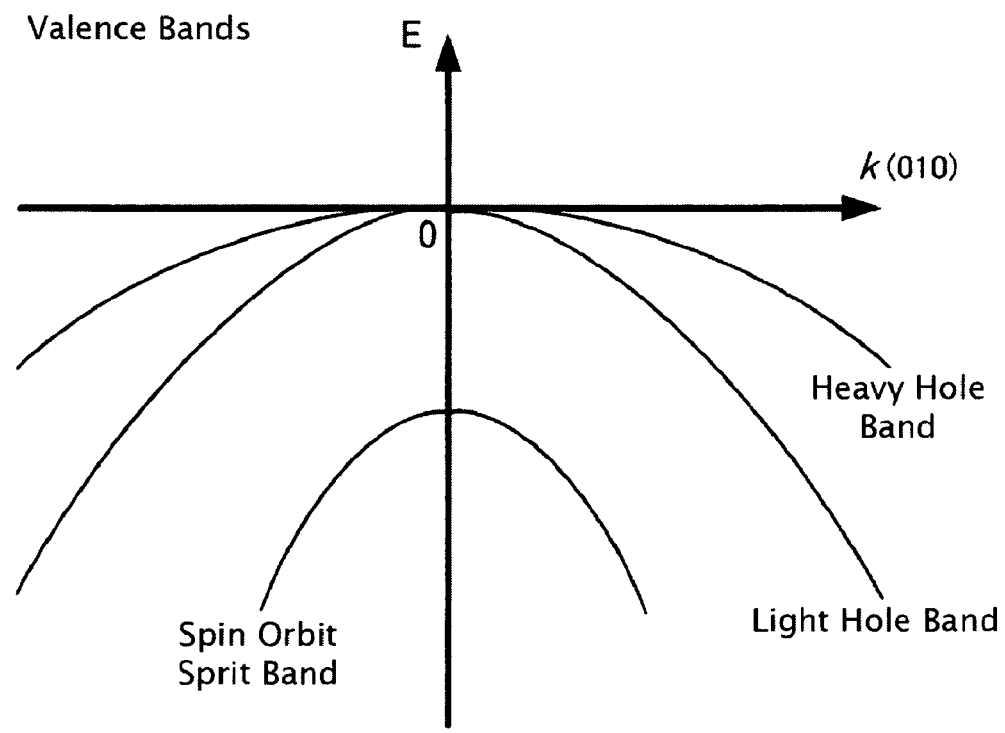

METHOD OF MANUFACTURING SILICON CARBIDE SEMICONDUCTOR DEVICE

CROSS REFERENCE TO RELATED APPLICATIONS

This application claims priority from Japanese application Serial No. JP 2004-018675, filed on Jan. 27, 2004, the contents of which are incorporated herein in their entirety.

BACKGROUND OF THE INVENTION

A. Field of the Invention

The invention relates generally to a method of manufacturing a silicon carbide semiconductor device (hereinafter referred to as a "SiC semiconductor device). Specifically, the present invention relates to a method of manufacturing a SiC semiconductor device having a MOS-type gate structure employing SiC for the semiconductor material thereof.

B. Description of the Related Art

The use of silicon carbide (hereinafter referred to as "SiC") in power semiconductor devices has been investigated. The band gap of 4H-SiC is a very wide 3.25 eV, which is 3 times as wide as the band gap of silicon (hereinafter referred to as "Si"), which is 1.12 eV. Furthermore, the electric field strength in SiC is from 2 to 4 MV/cm, or about one order of magnitude higher than that in Si. It is known that the resistance of a semiconductor device in the ON-state thereof (hereinafter referred to as the "on-resistance") is generally inversely proportional to the cube of the electric field strength and inversely proportional to the carrier mobility. Although the carrier mobility in SiC is lower than the carrier mobility in Si, the on-resistance of a SiC device can be reduced to several hundredths of the on-resistance of the Si device. Therefore, SiC devices have been expected to be power semiconductor devices for the next generation. Various SiC devices such as SiC diodes, SiC transistors, and SiC thyristors have been fabricated experimentally. These SiC devices include MOS field effect transistors having a MOS-type gate structure (hereinafter referred to as "MOSFETs"). The MOSFETs further include double-implanted MOSFETs (hereinafter referred to as "DIMOSFETs") having a double-diffused channel structure and UMOSFETs, having a gate structure that includes a gate buried in a U-shaped trench.

FIG. 15 is a cross sectional view of a conventional vertical DIMOSFET using SiC. FIG. 15 shows the cross section of one cell in the SiC n-channel DIMOSFET. Referring now to FIG. 15, SiC vertical DIMOSFET 100 includes n-type SiC substrate 101 exhibiting low electrical resistance and n-type drift layer 102 formed on n-type SiC substrate 101 by the epitaxial growth of a SiC layer. P-type base region 103 is formed by implanting aluminum ions (hereinafter referred to as "Al ions") and such p-type impurity ions into the surface portion of n-type drift layer 102. N-type source region 104 is formed by implanting nitrogen ions (hereinafter referred to as "N ions") or phosphorus ions (hereinafter referred to as "P ions") into the surface portion of p-type base region 103 such that n-type source region 104 is surrounded by p-type base region 103. Gate oxide film 105 is formed on the semiconductor structure formed so far and polysilicon gate electrode 106 is formed on gate oxide film 105. Gate electrode 106 is covered with insulator film 107. Source electrode 108 contacting commonly with p-type base region 103 and n-type source region 104 is formed on p-type base region 103 and n-type source region 104. Drain electrode 109 is formed on the back surface of n-type SiC substrate 101.

In SiC vertical DIMOSFET 100, the sandwiched portion of p-type base region 103, sandwiched between n-type source region 104 and n-type drift layer 102 beneath gate electrode 106, works as channel region 110. To improve the characteristics of the MOSFET, it is important to control the lengths L1 of channel regions 110 to be identical between the cells in the ion implantation steps for forming p-type base regions 103 and n-type source regions 104. A method of forming channel regions 110 with the lengths thereof controlled has been proposed (cf. JP P2000-22137A, paragraphs [0035] through [0044] and FIGS. 1 and 2).

When a sufficiently large negative bias voltage is applied to gate electrode 106 in the OFF-state in which source electrode 108 has been biased at the ground potential, the SiC vertical DIMOSFET is in accumulation mode, in which holes are induced in channel region 110 and no current flows. Since the junction between n-type drift layer 102 and p-type base region 103 is biased in reverse when a positive high voltage is applied to drain electrode 109, depletion layers expand into n-type drift layer 102 and p-type base region 103 and a high voltage is sustained while the current is suppressed at a low value, resulting in the OFF-state of the device. When a sufficiently high positive bias voltage is applied to gate electrode 106 in the OFF-state of the device, the SiC vertical DIMOSFET is in inversion mode, in which electrons are induced in channel region 110 and electrons flow from source electrode 108 to drain electrode 109 via n-type source region 104, channel region 110 (inversion layer), n-type drift layer 102, and n-type SiC substrate 101. This results in the ON-state of the device. When a negative bias voltage is applied again to gate electrode 106 in the ON-state of the device, the inversion layers vanish and the current paths are interrupted, resulting in the OFF-state of the device.

The on-resistance of SiC vertical DIMOSFET 100 is the sum of the resistance components. The resistance components include the contact resistance of source electrode 108, the source resistance, the channel resistance of the inversion layer, the accumulation resistance caused against the electron movement in the vicinity of the boundary between n-type drift layer 102 and gate oxide film 105, the JFET resistance caused against the electron flow in the portion of n-type drift layer 102, sandwiched between p-type base regions 103, from the vicinity of gate oxide film 105 toward n-type SiC substrate 101, the resistance of n-type drift layer 102 in the thickness direction thereof excluding p-type base regions 103, the substrate resistance, and the contact resistance of drain electrode 109.

SiC vertical DIMOSFET 100 exhibits the following advantages. First, since any built-in voltage is not caused in SiC vertical DIMOSFET 100, theoretically the on-resistance of SiC vertical DIMOSFET 100 is lower than the on-resistance of the bipolar devices. Second, since SiC vertical DIMOSFET 100 is a unipolar device, carrier accumulation does not occur in the ON-state thereof and therefore the switching loss thereof is low. Third, since SiC vertical DIMOSFET 100 is a voltage-driven-type device, the ON-OFF operations thereof are conducted by applying positive and negative voltages to the gate electrode and the driving circuit for driving SiC vertical DIMOSFET 100 is simple.

FIG. 16 is a cross sectional view of a conventional vertical UMOSFET using SiC. FIG. 16 shows the cross section of one cell in the SiC n-channel UMOSFET. Referring now to FIG. 16, SiC vertical UMOSFET 200 includes, in the same manner as SiC vertical DIMOSFET 100 does, n-type SiC substrate 201 which exhibits low electrical resistance and n-type drift layer 202 formed on n-type SiC substrate 201 by the epitaxial growth of a SiC layer. P-type base region 203 is formed on n-type drift layer 202 by the epitaxial growth of a SiC layer. N-type source region 204 is formed by implanting N ions or P ions into the surface portion of p-type base region 203. Then, a trench is etched down to n-type drift layer 202 by reactive ion etching (hereinafter referred to as "RIE"). Gate oxide film 205, gate electrode 206 and insulator layer 207 are formed such that gate oxide film 205, gate electrode 206 and insulator layer 207 cover the trench. Source electrode 208 contacting commonly with p-type base region 203 and n-type source region 204 is formed on p-type base region 203 and n-type source region 204. Drain electrode 209 is formed on the back surface of n-type SiC substrate 201. In SiC vertical UMOSFET 200, the portion of p-type base region 203 between n-type source region 204 and n-type drift layer 202 serves as channel region 210.

SiC vertical UMOSFET 200 conducts ON-OFF operations in the same manner as SiC vertical DIMOSFET 100. However, the accumulation resistance and the JFET resistance, which are caused in SiC vertical DIMOSFET 100, are not caused in SiC vertical UMOSFET 200. Since no JFET resistance is caused, the distance between adjacent p-type base regions 203 and 203 can be shortened and, therefore, the cell pitch can be shortened. Since the cell pitch can be shortened, the on-resistance of SiC vertical UMOSFET 200 can be set to be lower than the on-resistance of SiC vertical DIMOSFET 100.

Various proposals have been made for improving the characteristics of conventional SiC semiconductor devices. For example, the boundary between the channel region and the gate insulator film is brought into a good shape by interposing a buffer layer formed by the thermal oxidation of SiC between the SiC channel region and the gate insulator film to prevent carrier trapping and carrier scattering so that the carrier mobility may be improved (cf. JP P2002-222950A, Paragraphs [0045] through [0047] and FIG. 4). The carrier mobility also is improved by doping carbon into the Si channel layer, which exerts tensile stress to the channel region and improves the carrier mobility (cf. JP PHei.8 (1996)-111528A, Paragraphs [0014] through [0017] and FIGS. 1 and 2).

As the breakdown voltage of the SiC semiconductor device is set to be higher, the resistance of the drift layer rises as described in the following formula (1):

$$R_{drift} = 4BV^2/(\mu \epsilon E_{CR}^3) \quad (1)$$

Here, BV represents the dielectric breakdown voltage, $\mu$ represents the carrier mobility, $\epsilon$ represents the dielectric permeability of the semiconductor, and $E_{CR}$ represents the critical electric field strength of the semiconductor. The $R_{drift}$ described by the formula (1) is the minimum on-resistance of the unipolar device. The on-resistance related by the formula (1) with the dielectric breakdown voltage is called a "unipolar limit," which indicates the theoretical lower limit value of the on-resistance.

However, various resistance components are caused in SiC semiconductor device in addition to the drift layer resistance. Due to the additional resistance components, the real on-resistance is far from the unipolar limit. As the dielectric breakdown voltage is lower, the ratios of the other resistance components to the drift layer resistance become higher.

In the MOSFET for example, the channel resistance described in the following formula (2) occupies a large part.

$$R_{CH} = L/\{WC_{OX}\mu_n (V_G - V_T)\} \quad (2)$$

Here, L represents the channel length, W the channel width, $C_{OX}$ the oxide film capacitance, $\mu_n$ the electron mobility, $V_G$ the gate voltage, and $V_T$ the threshold gate voltage.

In the JFET, JFET resistance is caused when the length of the drift layer sandwiched by the gate regions is short. Although the JFET resistance may be set to be negligible by elongating the length of the drift layer sandwiched by the gate regions, the resistance component caused against the electrons flowing through the deep portions of the gate regions and described in the following formula (3) is added to the total resistance.

$$R = L_{JFET}/(q \mu_n n) \cdot (\text{Ratio}) \quad (3)$$

Here, $L_{JFET}$ represents the depth of the gate region, q the charge quantity, $\mu_n$ the electron mobility, n the electron density in the drift layer, and (Ratio) the ratio of the area of the drift layer in each cell sandwiched by the gate regions to the total area of each cell.

Although various resistance components contribute to the on-resistance, the resistance values of the MOSFET and the JFET are affected greatly by the electron mobility $\mu_n$. In the JFET, the electron mobility $\mu_n$ is the electron mobility in the bulk. In the MOSFET, the electron mobility gun is lower than the electron mobility in the bulk, since the number of the electrons is reduced by the trapping thereof by the trap levels existing in the boundary between SiC and the gate oxide film and Coulomb scattering is caused by the trapped electrons. To obviate this problem, the boundary levels are lowered or the channel is spaced apart from the boundary to minimize the influence of the boundary levels. One target is to make the electron mobility $\mu_n$ closer to the electron mobility in the bulk as much as possible. Although the electron mobility $\mu_n$ may be made to be closer to the electron mobility in the bulk, the channel resistance still occupies a large part of the drift layer resistance at a low breakdown voltage lower than 1 kV.

In view of the foregoing, it would be desirable to obviate the problems described above. It would also be desirable to provide a method of manufacturing a SiC semiconductor device that facilitates greatly improving the carrier mobility in the device and greatly reducing the on-resistance even at a low breakdown voltage. The present invention is directed to overcoming or at least reducing the effects of one or more of the problems set forth above.

SUMMARY OF THE INVENTION

According to the invention, there is provided a method of manufacturing a SiC semiconductor device including a SiC substrate of a first conductivity type, a SiC drift layer of the first conductivity type on the substrate, SiC base regions of a second conductivity type contacting with the drift layer, a SiC source region of the first conductivity type contacting with the base region, a gate electrode covering the sandwiched portion of the base region sandwiched between the drift layer and the source region with a gate insulator film interposed therebetween, a source electrode contacting commonly with the base region and the source region, and a drain electrode on the back surface of the substrate, the method including exerting stress to SiC in the region in which carriers flow, to change the crystal lattice intervals of the SiC.

By the manufacturing method described above, stress is exerted to the SiC crystal in the region in which carriers flow, and the crystal lattice intervals in the SiC crystal are changed. Since the degeneration in the bottom of the conduction bands is dissolved, since the inter-band scattering is prevented from occurring, and since the effective electron mass is reduced due to the strain introduced by the stress exerted to the SiC crystal in the region in which carriers flow, the carrier mobility in the region in which the carriers flow is improved and the resistance in the region in which the carriers flow is reduced.

The method of manufacturing a SiC semiconductor device according to the invention, which exerts stress to SiC in the region in which carriers flow and changes the crystal lattice intervals in the SiC, facilitates improving the carrier mobility in the region in which the carriers flow and reducing the resistance in the region in which the carriers flow. Therefore, the method of manufacturing a SiC semiconductor device according to the invention facilitates providing a SiC semiconductor device that exhibits low on-resistance close to the unipolar limit even at a low semiconductor breakdown voltage and, therefore, exhibits excellent performance.

BRIEF DESCRIPTION OF THE DRAWINGS

The foregoing advantages and features of the invention will become apparent upon reference to the following detailed description and the accompanying drawings, of which:

FIG. 1 shows a band structure in the end portions of the valence bands and a band structure in the end portions of the conduction bands of SiC, on which tensile stress is exerted.

FIG. 2 shows a band structure in the end portions of the valence bands and a band structure in the end portions of the conduction bands of SiC, on which no stress is exerted.

DETAILED DESCRIPTION OF SPECIFIC EMBODIMENTS

Figure 3:
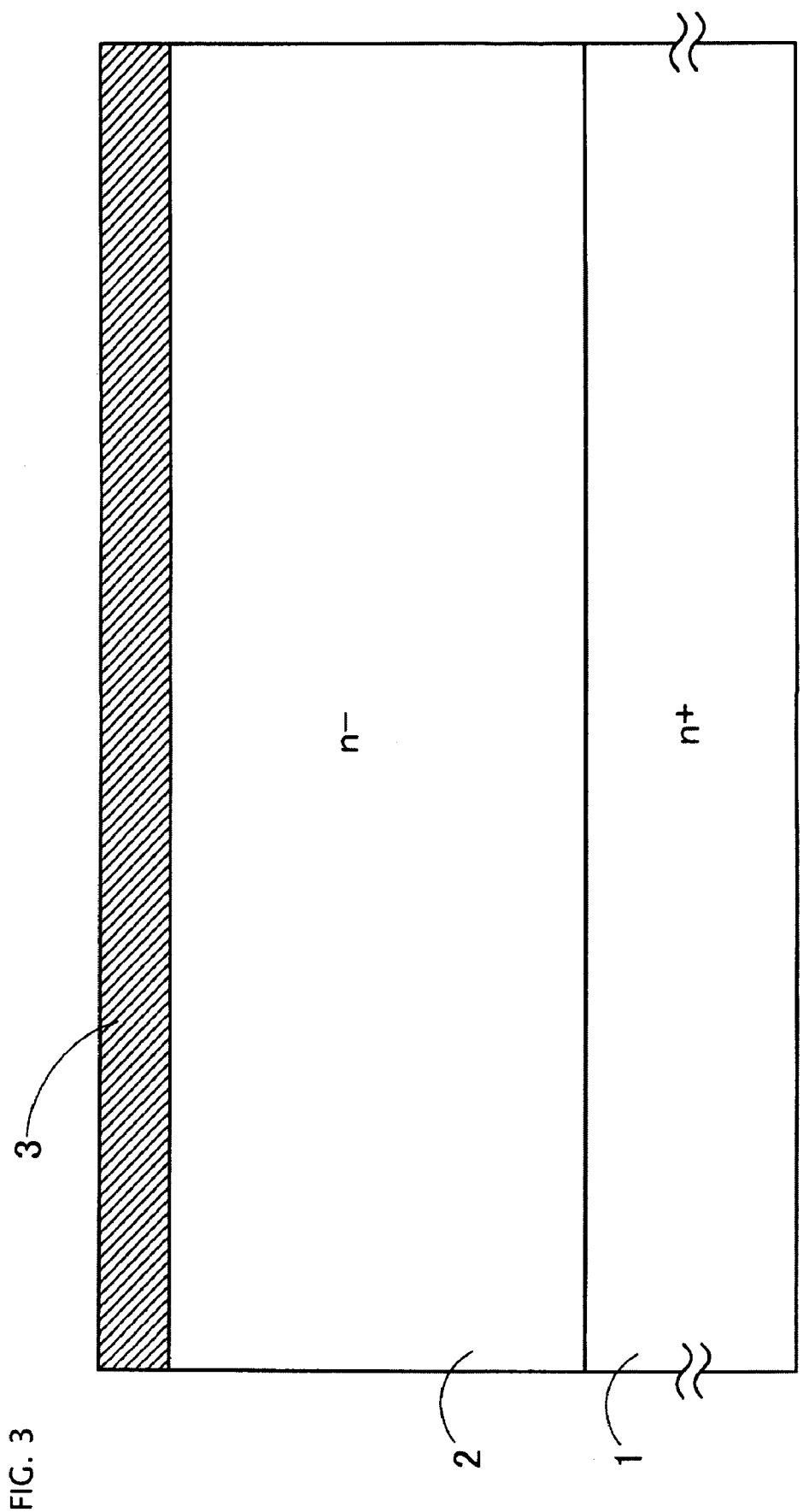
FIG. 3 is a cross sectional view describing the step of forming an AlN thin film according to a first embodiment of the invention.

Now the invention will be described in detail hereinafter with reference to the accompanied drawing figures which illustrate the preferred embodiments of the invention.

The present method of manufacturing a SiC semiconductor device exerts stress on the semiconductor material of the device to cause a strained region. The crystal lattice intervals in the strained region are different from the crystal lattice intervals in the region where stress is not exerted, so that a current may flow through the strained region. By forming an $Al_xGa_{1-x}N$ ($0 \leq x \leq 1$) thin film including aluminum nitride (hereinafter referred to as "AlN") and/or gallium nitride (hereinafter referred to as "GaN") and by forming a SiC layer constituting a channel region and such a region wherein carriers flow, on the $Al_xGa_{1-x}N$ thin film, tensile stress or compressive stress is exerted on the SiC layer. Hereinafter, the $Al_xGa_{1-x}N$ thin film will be referred to simply as the "AlGaN thin film". The term "AlGaN thin film" also will be used to describe an AlN thin film (x=1) and for describing a GaN thin film (x=0).

FIG. 1 shows a band structure in the end portions of the valence bands and a band structure in the end portions of the conduction bands of SiC, on which tensile stress is exerted. FIG. 2 shows a band structure in the end portions of the valence bands and a band structure in the end portions of the conduction bands of SiC on which no stress is exerted. As shown in FIG. 2, the shapes of the equipotential surfaces existing in the first Brillouin zone are the same as each other when no stress is exerted. In this state, the conduction bands degenerate in the bottoms thereof. In contrast, the tensile stress exerted on SiC changes the lattice interval along each crystal axis from the lattice interval under no tensile stress. In other words, the tensile stress exerted distorts the crystal. It is possible to make the shapes of the equipotential surfaces in the first Brillouin zone differ a little bit form each other, as shown in FIG. 1, by exerting tensile stress on SiC. As a result, the conduction bands dissolve the degeneration in the bottoms thereof and it becomes possible to make the conduction bands split in the bottoms thereof or to make the valence bands split at the tops thereof. In this state, the conduction electrons enter preferentially into a band having a lower energy. Since the number of the bands having the same energy decreases, mutual scattering of the carriers in the bands having the same energy is prevented from occurring. As a result, the electron mobility is improved.

Only part of the equipotential surfaces which come out when no stress is exerted to SiC come out as compared with the situation where tensile stress is exerted on SiC. When no stress is exerted on SiC, the effective mass and the mobility of the electrons are isotropic in the equipotential surface, since anisotropy is not caused in the equipotential surface. When tensile stress is exerted on SiC, anisotropy is caused in the electron mobility. By making electrons flow in the direction in which the effective mass is the minimum, the electron mobility is improved more as compared with the situation where no stress is exerted on SiC (cf. the conduction band structures in FIGS. 1 and 2).

The degeneration of the bands for the light holes and for the heavy holes at the end portions of the valence bands is dissolved by the strain, and the light hole band is pushed up. Holes occupy the pushed-up light hole band preferentially. Since the inter-valley scattering by the holes is prevented from occurring, and the effective hole mass is reduced, the hole mobility is improved (cf. the valence band structures in FIGS. 1 and 2).

A strain is introduced to SiC, for example, by using the AlGaN thin film as described above. The differences between the lattice constants of the SiC crystal, the AlN crystal and the GaN crystal are used for strain introduction in SiC.

In AlN the side length a of the hexagon in the hexagonal unit cell is $3.112 \times 10^{-10}$ m and the unit cell length c along the c-axis of the hexagonal unit cell is $4.982 \times 10^{-10}$ m. The side length a is $3.189 \times 10^{-10}$ m and the unit cell length c is $5.186 \times 10^{-10}$ m in GaN. The side length a is $3.073 \times 10^{-10}$ m and the unit cell length c is $10.053\times10^{-10}$ cm in 4H-SiC. The side length a is $3.0806\times10^{-10}$ m and the unit cell length c is $15.1173\times10^{-10}$ m in 6H-SiC. The AlN crystal and the GaN crystal have 2H form. The c-axis length corresponding to the 2H form is c/2 (=$10.053\times10^{-10}/2$=$5.0265\times10^{-10}$ m) for 4H-SiC and c/3 (=$15.1173\times10^{-10}/3$=$5.0391\times10^{-10}$ m) for 6H-SiC.

Although the lattice constants of SiC, AlN and GaN differ, they are very close to each other. Therefore, a strain is introduced in the SiC crystal by growing a SiC layer on an AlGaN thin film. The lattice constants of the AlGaN thin film can be changed by changing the ratio of AlN and GaN. Tensile stress or compressive stress is exerted on SiC by changing the lattice constants of AlGaN thin film.

Since AlN and GaN exhibit the maximum breakdown electric field strength equal to or higher than the maximum breakdown electric field strength of SiC, the AlGaN thin film used in the SiC semiconductor device does not lower the breakdown voltage of the SiC semiconductor device. The sublimation temperatures of AlN and GaN are higher than 1600° C., much higher than 1500° C., at which the SiC layer is usually grown. Since it is easy to grow a SiC crystal after forming an AlGaN thin film, it is possible to grow a SiC layer with excellent crystal quality on the AlGaN thin film.

Alternatively, a strain is introduced in SiC by implanting Ar ions into SiC and by subsequent annealing. Still alternatively, a strain is introduced to the target SiC layer in a completed device by exerting mechanical pressure to the completed device.

Figure 4:
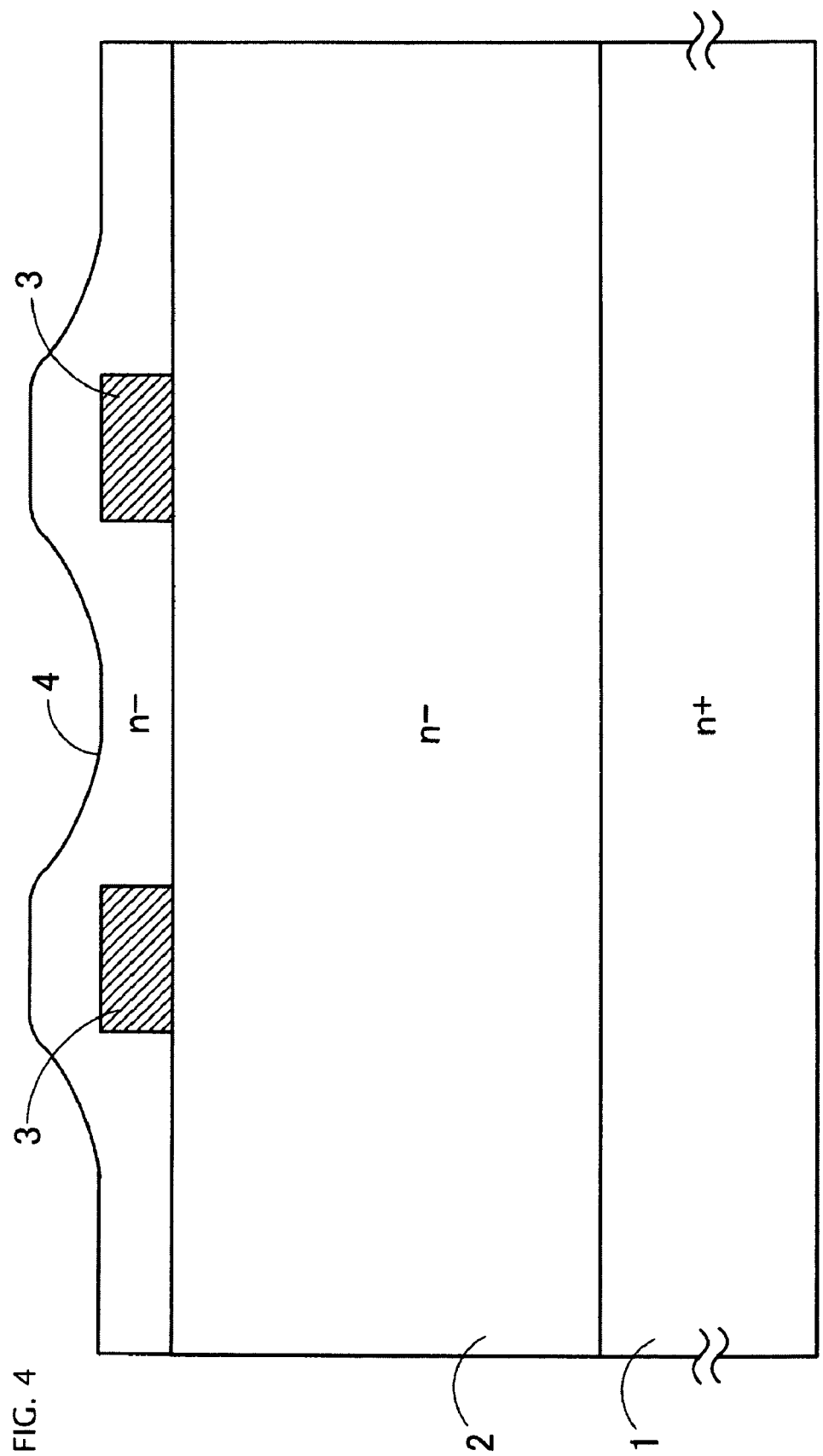
FIG. 4 is a cross sectional view describing the step of growing a SiC layer according to the first embodiment of the invention.
Figure 5:
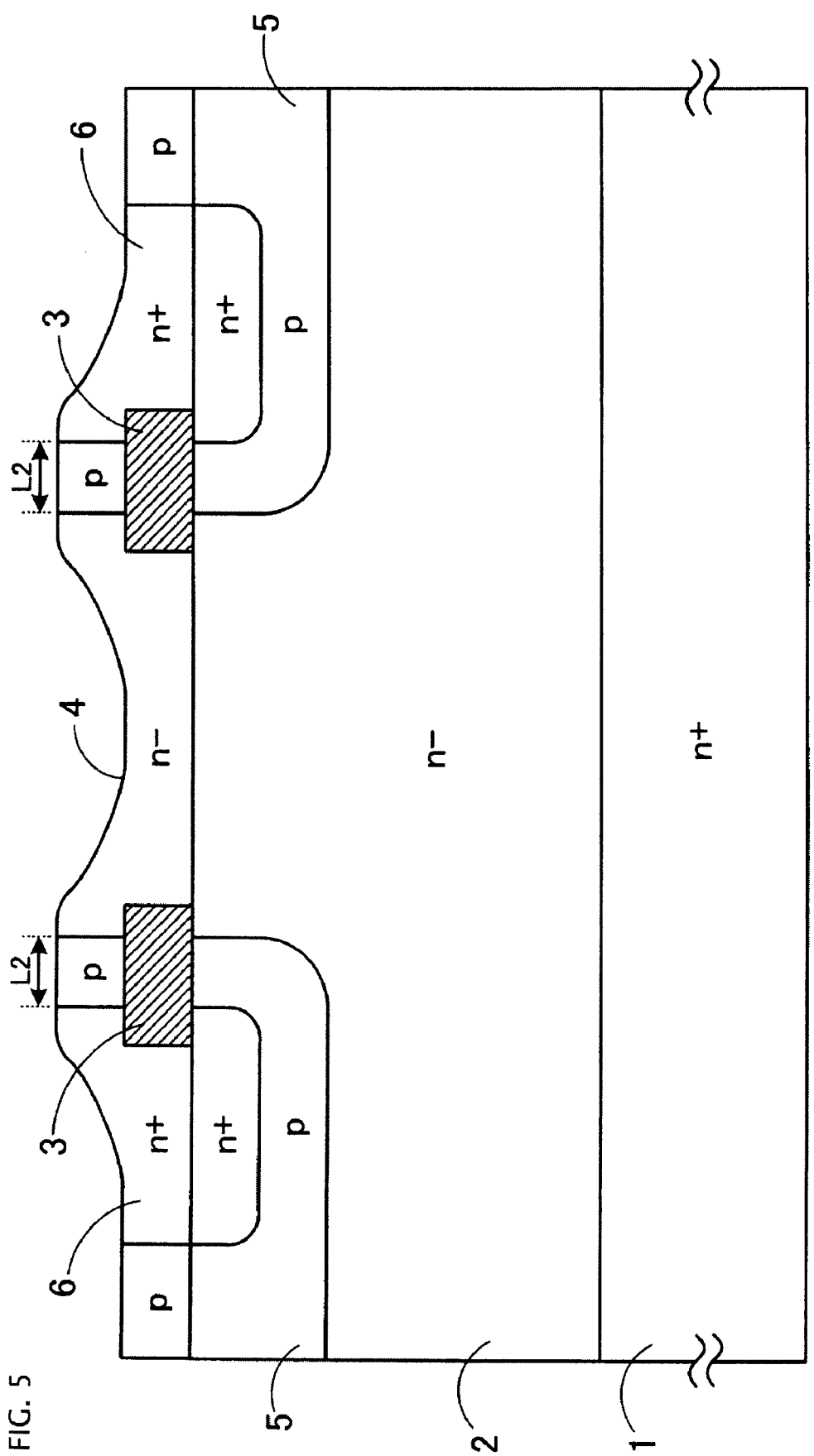
FIG. 5 is a cross sectional view describing the step of forming a base region and a source region according to the first embodiment of the invention.
Figure 6:
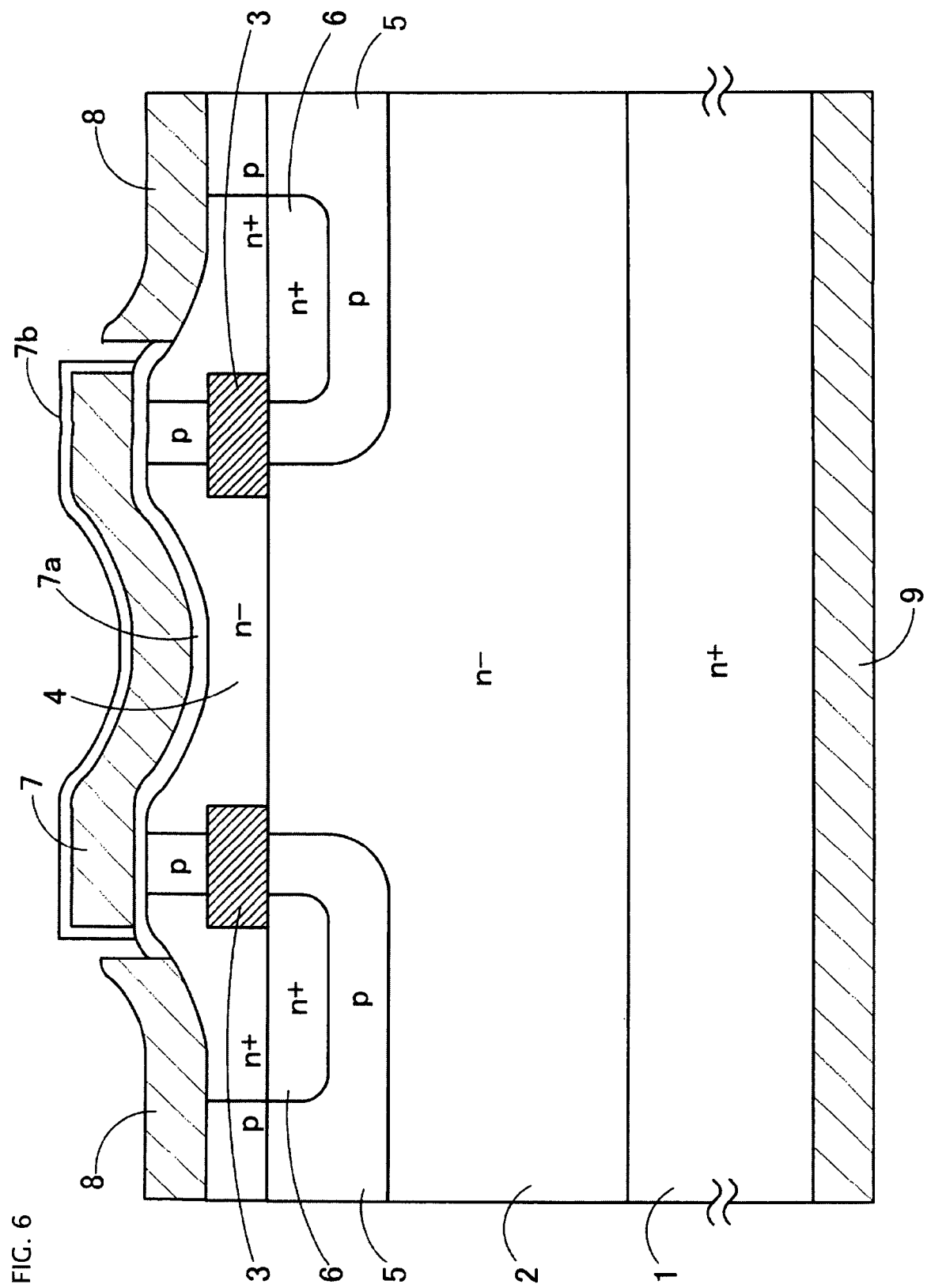
FIG. 6 is a cross sectional view describing the step of forming electrodes according to the first embodiment of the invention.

Now a method of manufacturing a SiC semiconductor device according to a first embodiment of the invention will be described below in detail. FIGS. 3 through 6 are cross sectional views describing the steps for manufacturing a SiC vertical DIMOSFET according to the first embodiment of the invention. In detail, FIG. 3 is a cross sectional view describing the step of forming an AlN thin film according to the first embodiment of the invention. FIG. 4 is a cross sectional view describing the step of growing a SiC layer according to the first embodiment of the invention. FIG. 5 is a cross sectional view describing the step of forming a base region and a source region according to the first embodiment of the invention. FIG. 6 is a cross sectional view describing the step of forming electrodes according to the first embodiment of the invention.

According to the first embodiment, a SiC vertical DIMOSFET is manufactured as described below. Referring now to FIG. 3, n-type drift layer 2 is formed by growing a 4H-SiC epitaxial layer by thermal chemical vapor deposition (hereinafter referred to as "thermal CVD") on n-type 4H-SiC substrate 1 having an exposed (1-100) plane or an exposed (11-20) plane. The resulting n-type drift layer 2 is 5 μm in thickness and the n-type impurity concentration therein is $1\times10^{16}$ cm$^{-3}$. Then, AlN thin film 3 is formed on n-type drift layer 2 by growing a 4H-AlN layer by molecular beam epitaxy (hereinafter referred to as "MBE").

Then, the formed AlN thin film 3 is patterned in a chlorine atmosphere (hereinafter referred to as a "Cl$_2$ atmosphere") by RIE so that all the channel regions may be on the 4H-AlN layer. By this patterning AlN thin films 3 are left in the regions on which channel regions will be formed as shown in FIG. 4.

Then, SiC layer 4 is formed on n-type drift layer 2 and AlN thin films 3 by growing an n-type 4H-SiC layer of 40 nm in thickness by MBE as shown in FIG. 4. Tensile stress is exerted to the portions of the 4H-SiC layer grown on AlN thin films 3 due to the differences between the lattice constants thereof. The lattice intervals of the 4H-SiC crystal on AlN thin films 3 become wider as compared with the lattice intervals of the 4H-SiC crystal on which no tensile stress has been exerted.

The changes in the crystal lattice intervals are observed by reflective high energy electron diffraction (hereinafter referred to as "RHEED").

Referring now to FIG. 5, p-type base regions 5 are formed by implanting Al ions into SiC layer 4, AlN thin films 3, and n-type drift layer 2. The depth of p-type base region 5 is 1 μm from the surface of n-type drift layer 2 and the p-type impurity concentration in p-type base region 5 is $1\times10^{17}$ cm$^{-3}$. Then, n-type source region 6 is formed in the surface portion of p-type base region 5 by implanting N ions. The depth of n-type source region 6 is 0.3 μm from the surface of n-type drift layer 2 and the n-type impurity concentration in n-type source region 6 is $1\times10^{19}$ cm$^{-3}$. N-type SiC layer 4 between AlN thin films 3 and 3 works as a part of the drift layer together with the portion of n-type drift layer 2 beneath n-type SiC layer 4. P-type base region 5 on AlN thin film 3 and between n-type SiC layer 4 and n-type source region 6 works as a channel region of the device. In forming p-type base regions 5 and n-type source regions 6, the surface length L2 of the channel regions is adjusted to be 1 μm. The n-type source regions 6 and the channel regions are arranged so that the carriers may flow, while the device is operating, in perpendicular to the c-axis of SiC through the inversion layer created in the (1-100) plane or the (11-20) plane.

Referring now to FIG. 6, gate oxide film 7a is formed as a gate insulator film. Then, polysilicon gate electrode 7 is formed on gate oxide film 7a such that gate electrode 7 covers all the channel regions. Then, the surface of gate electrode 7 is covered with insulator film 7b. Gate oxide film 7a, gate electrode 7, and insulator film 7b constitute an electrode section. Then, source electrode 8 is formed such that source electrode 8 contacts commonly with p-type base region 5 and n-type source region 6. Then, drain electrode 9 is formed on the back surface of n-type SiC substrate 1.

As described above, tensile stress is exerted to a SiC layer that will work as a channel region by forming the SiC layer on AlN thin film 3 according to the first embodiment. The structure that facilitates exerting tensile stress on the channel region improves the electron mobility and reduces the channel resistance.

The SiC vertical DIMOSFET manufactured by the method according to the first embodiment of the invention exhibits the improved electron mobility of about 200 cm$^2$/Vs, twice as high as the electron mobility of about 100 cm$^2$/Vs in the conventional SiC vertical DIMOSFET that does not use AlN thin film 3. As a result, the channel resistance is reduced from the conventional 1 mΩcm$^2$ to 0.5 mΩcm$^2$. Therefore, the manufacturing method according to the first embodiment facilitates reducing the on-resistance of the SiC semiconductor device close to the unipolar limit, which is the theoretical lower limit value, even when the SiC semiconductor device exhibits a low breakdown voltage of 1 kV or lower. Thus, the SiC semiconductor device manufactured by the method according to the first embodiment facilitates exhibiting higher performances.

In manufacturing a SiC vertical DIMOSFET by the method according to the first embodiment, 6H-SiC and 6H-AlN may be used in substitution for 4H-SiC and 4H-AlN, respectively. Alternatively, GaN or Al$_x$Ga$_{1-x}$N (0<x<1) may be used in substitution for AlN. Still alternatively, a SiC vertical DIMOSFET may be manufactured by inverting the conductivity types of the constituent layers and regions.

Figure 7:
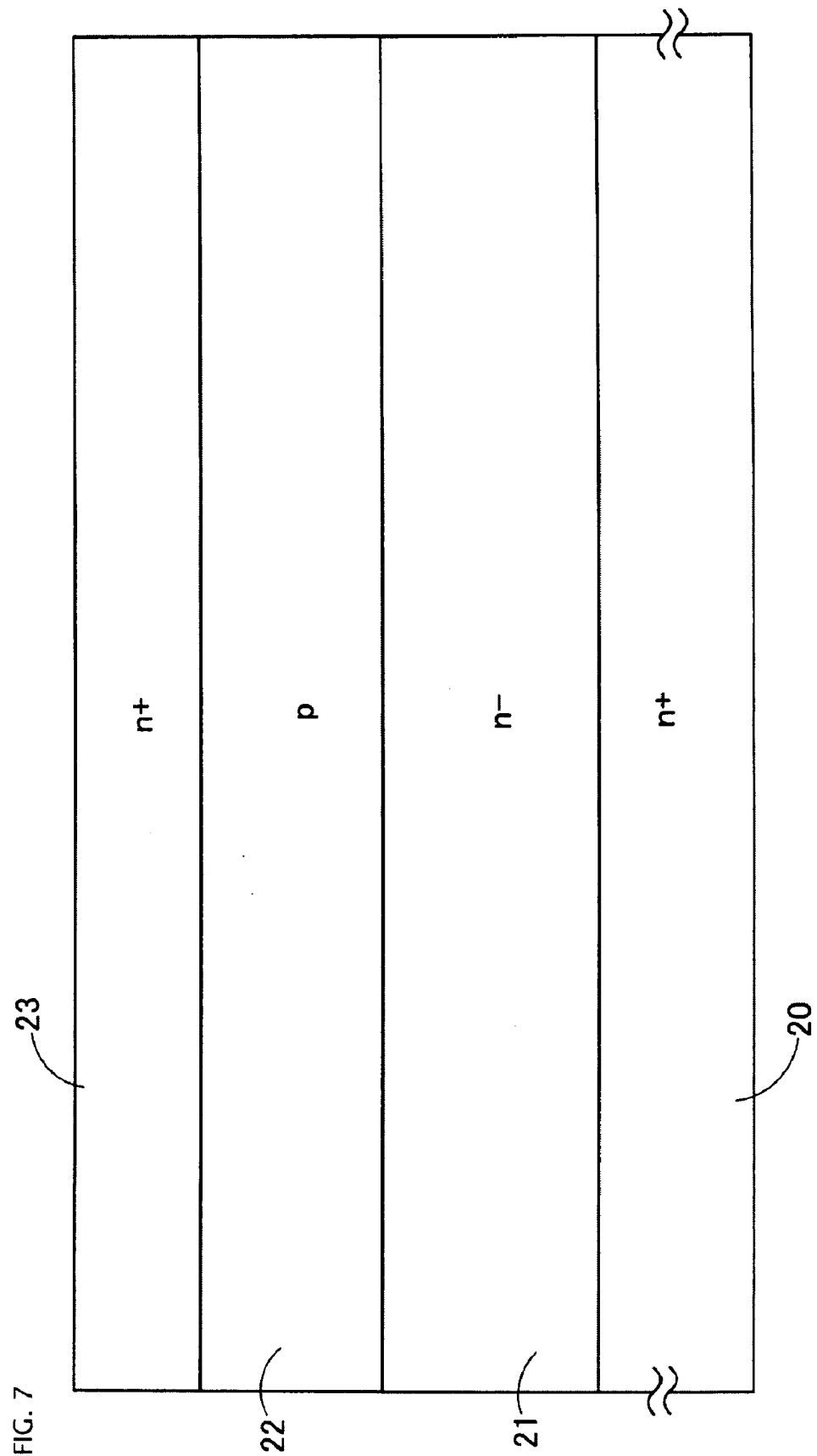
FIG. 7 is a cross sectional view describing the step of epitaxial growth according to a second embodiment of the invention.
Figure 8:
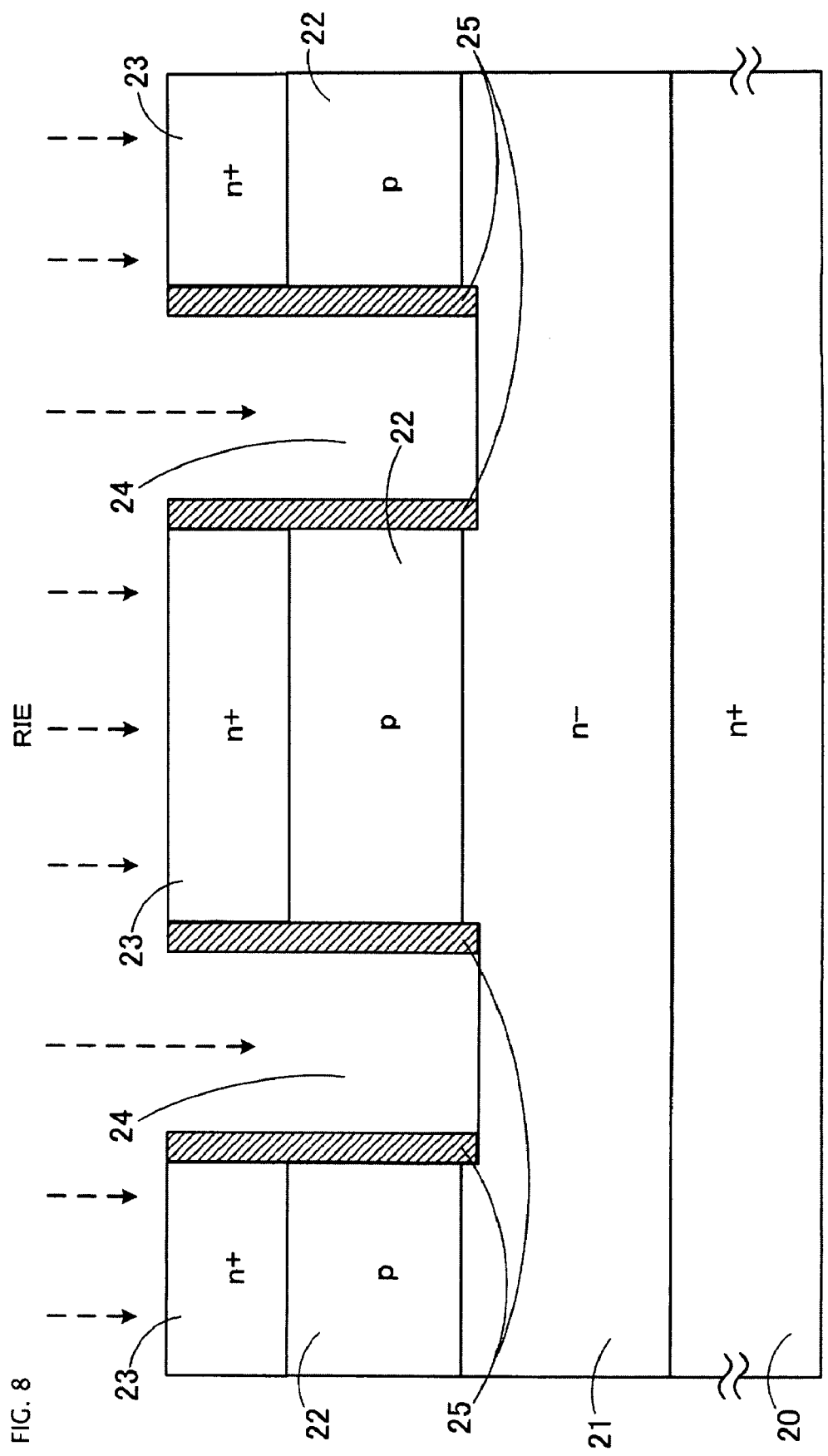
FIG. 8 is a cross sectional view describing the step of forming a trench according to the second embodiment of the invention.
Figure 9:
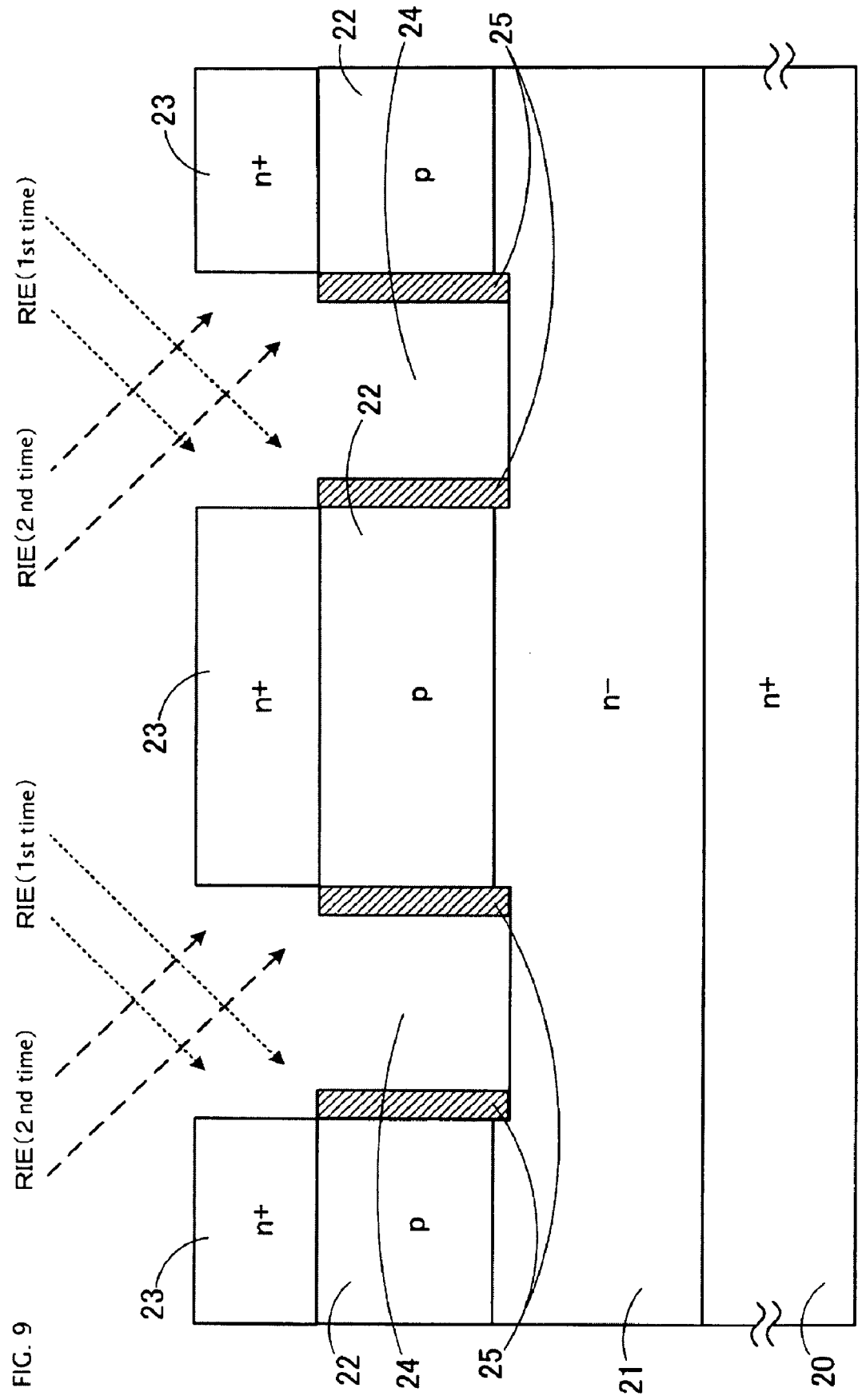
FIG. 9 is a cross sectional view describing the step of forming an AlN thin film according to the second embodiment of the invention.
Figure 10:
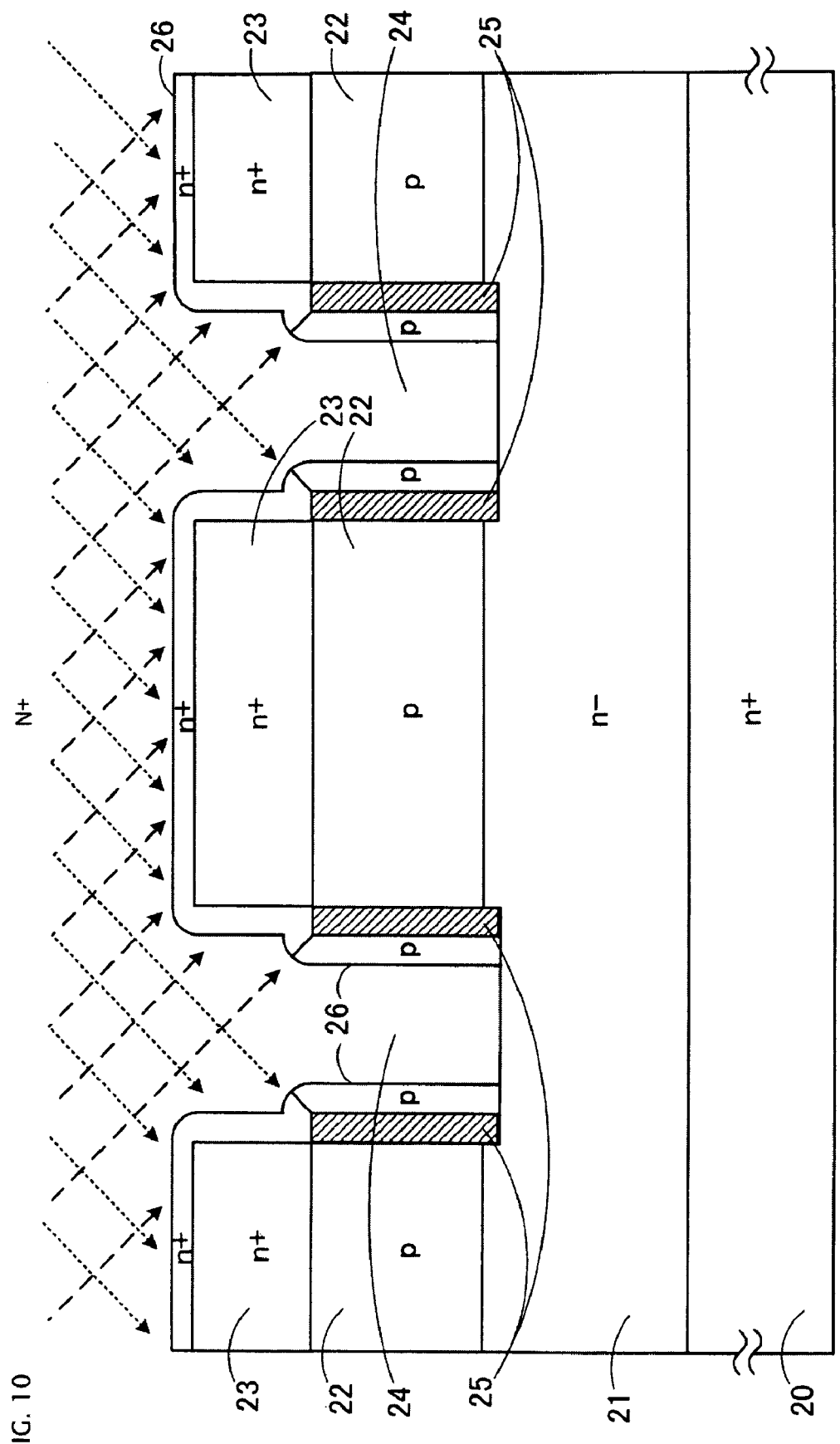
FIG. 10 is a cross sectional view describing the step of forming a base region and a source region according to the second embodiment of the invention.
Figure 11:
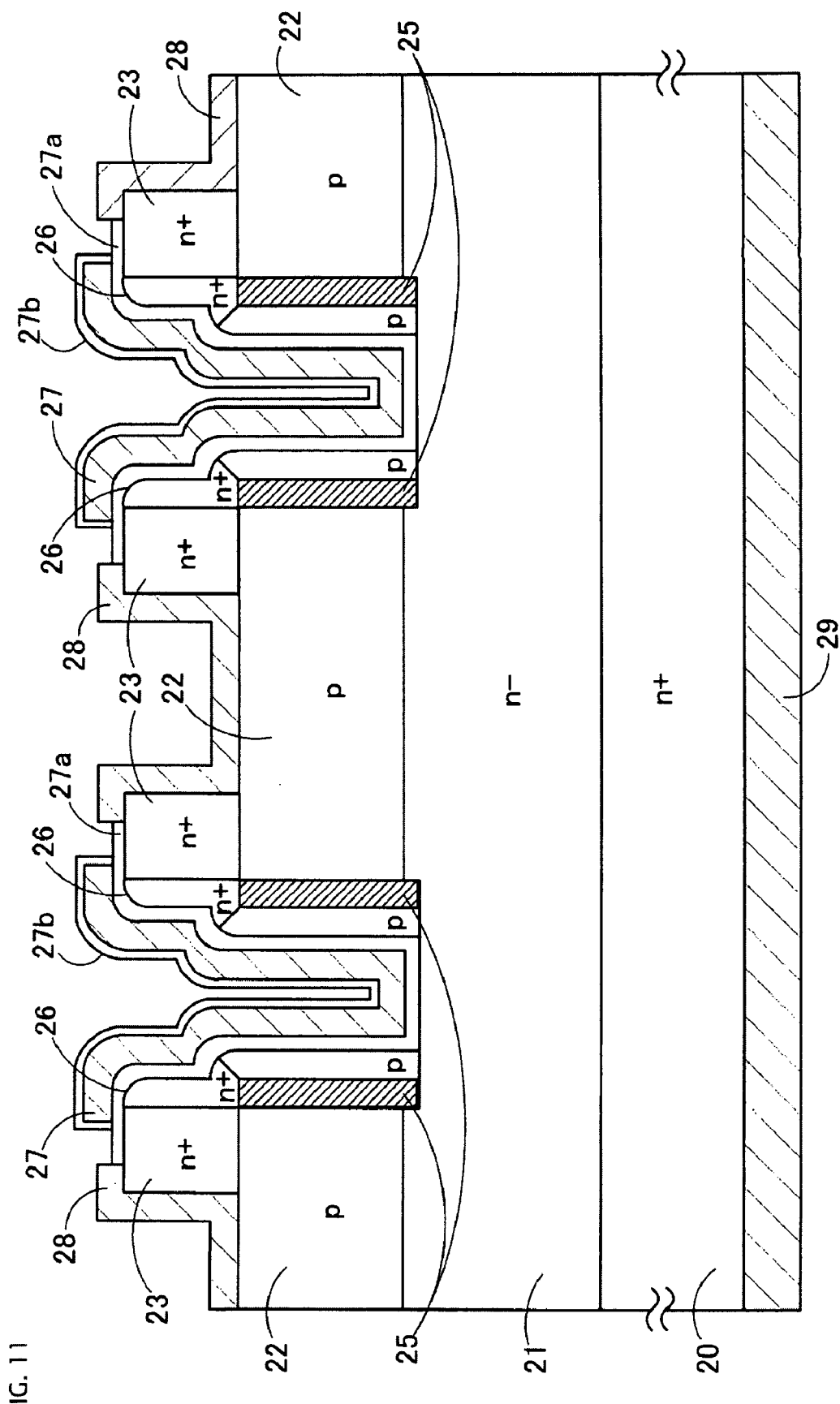
FIG. 11 is a cross sectional view describing the step of forming electrodes according to the second embodiment of the invention.

Now a method of manufacturing a SiC semiconductor device according to a second embodiment of the invention will be described below. FIGS. 7 through 11 are cross sectional views describing the steps for manufacturing a SiC vertical UMOSFET according to a second embodiment of the invention. In detail, FIG. 7 is a cross sectional view describing the step of epitaxial growth according to the second embodiment of the invention. FIG. 8 is a cross sectional view describing the step of forming a trench according to the second embodiment of the invention. FIG. 9 is a cross sectional view describing the step of forming an AlN thin film according to the second embodiment of the invention. FIG. 10 is a cross sectional view describing the step of forming a base region and a source region according to the second embodiment of the invention. FIG. 11 is a cross sectional view describing the step of forming electrodes according to the second embodiment of the invention.

According to the second embodiment, a SiC vertical UMOSFET is manufactured as described below. Referring now to FIG. 7, n-type 4H-SiC drift layer 21 is grown in an epitaxial manner by thermal CVD on n-type 4H-SiC substrate 20 having an exposed (0001) plane. Then, p-type 4H-SiC base layer 22 is grown in an epitaxial manner by thermal CVD on n-type drift layer 21. Then, n-type 4H-SiC source layer 23 is grown in an epitaxial manner by thermal CVD on p-type base layer 22. The impurities and the impurity concentrations in n-type drift layer 21, p-type base layer 22, and n-type source layer 23 are the same as the respective impurities and the respective impurity concentrations in n-type drift layer 2, p-type base region 5, and n-type source region 6 in the SiC vertical DIMOSFET manufactured by the method according to the first embodiment.

Referring now to FIG. 8, trenches 24 are etched by RIE through n-type source layer 23 and p-type base layer 22 down to n-type drift layer 21. Trench 24 seen from the side of the (0001) plane of n-type 4H-SiC substrate 20 is shaped like a stripe. After forming trenches 24, a 4H-AlN layer of 100 nm in thickness is grown on the entire surface of the SiC laminate formed so far by the MBE method. Then, AlN thin films 25 are formed by removing the 4H-AlN layer from the surfaces of n-type source layers 23 and from the bottom surfaces of trenches 24 by RIE in a $Cl_2$ atmosphere such that the portions of the 4H-AlN layer on the side walls of trenches 24 remain. Then, each AlN thin film 25 remaining on the side wall of trench 24 is etched into stripes extending in perpendicular to the lengthwise direction of trench 24 by wet etching so that the potential of SiC layer 26 formed later on AlN thin film 25 may not be floating.

Referring now to FIG. 9, the SiC laminate formed so far is tilted at predetermined degrees of angle and the portion of each AlN thin film 25 remaining on one side wall of each n-type source layer 23 is removed by RIE in a $Cl_2$ atmosphere. Then, the SiC laminate formed so far is tilted at predetermined opposite degrees of angle, and the portion of each AlN thin film 25 remaining on the other side wall of each n-type source layer 23 is removed by RIE in a $Cl_2$ atmosphere. As a result, AlN thin films 25 are left on the side walls of p-type base layers 22 facing opposite to each other across the respective trenches 24.

Referring now to FIG. 10, p-type SiC layers 26 are formed by growing p-type 4H-SiC layers by thermal CVD. The thickness of p-type SiC layer 26 is 40 nm and the impurity concentration in p-type SiC layer 26 is $1\times10^{17}$ cm$^{-3}$. Then, the SiC laminate formed so far is tilted at predetermined degrees of angle and N ions are implanted to the portion of each p-type SiC layer 26 in contact with one side wall of each n-type source layer 23 at the acceleration voltage of 30 keV and at the dose amount of $1\times10^{14}$ cm$^{-2}$~$1\times10^{15}$ cm$^{-2}$ to convert the portion of each p-type SiC layer 26 in contact with the one side wall of n-type source layer 23 to be of n-type. Then, the SiC laminate is tilted in the opposite direction and N ions are implanted under the same conditions to the portion of each p-type SiC layer 26 in contact with the other side wall of each n-type source layer 23 to convert the portion of each p-type SiC layer 26 in contact with the other side wall of n-type source layer 23 to be of n-type. Then, the portions of p-type SiC layers 26 on the upper surfaces of n-type source layers 23 are removed by the RIE method or a like method. The portions of p-type SiC layers 26 converted to n-type layers and n-type source layers 23 work as the n-type source regions of the SiC vertical UMOSFET to be manufactured. The portions of p-type SiC layers 26 that remain unconverted and p-type base layers 22 work as the p-type base regions of the SiC vertical UMOSFET, in which channel regions are formed.

Referring now to FIG. 11, gate oxide films 27a are formed and polysilicon gate electrodes 27 covering the channel region are formed on the respective gate oxide films 27a so that gate electrodes 27 may cover the channel regions. Each gate electrode 27 is covered with an insulator film 27b. Then, a part of each n-type source layer 23 is removed selectively by RIE until p-type base layer 22 is exposed. Then, source electrodes 28 are formed such that source electrodes 28 contact commonly with respective p-type base layers 22 and n-type source layers 23. Then, a drain electrode is formed on the back surface of n-type SiC substrate 20.

As described above, tensile stress is exerted on the SiC layer on AlN thin film 25 according to the second embodiment. By exerting tensile stress on the SiC layer on AlN thin film 25, the electron mobility is improved and the channel resistance is reduced. The SiC vertical UMOSFET manufactured by the method according to the second embodiment exhibits the same high performance as the embodiment in which the SiC vertical DIMOSFET is manufactured by the method according to the first embodiment.

In manufacturing a SiC vertical UMOSFET by the method according to the second embodiment, 6H-SiC and 6H-AlN may be used in substitution for 4H-SiC and 4H-AlN, respectively. Alternatively, GaN or $Al_xGa_{1-x}N$ (0<x<1) may be used in substitution for AlN. Still alternatively, a SiC vertical UMOSFET may be manufactured by inverting the conductivity types of the constituent layers and regions.

Figure 12:
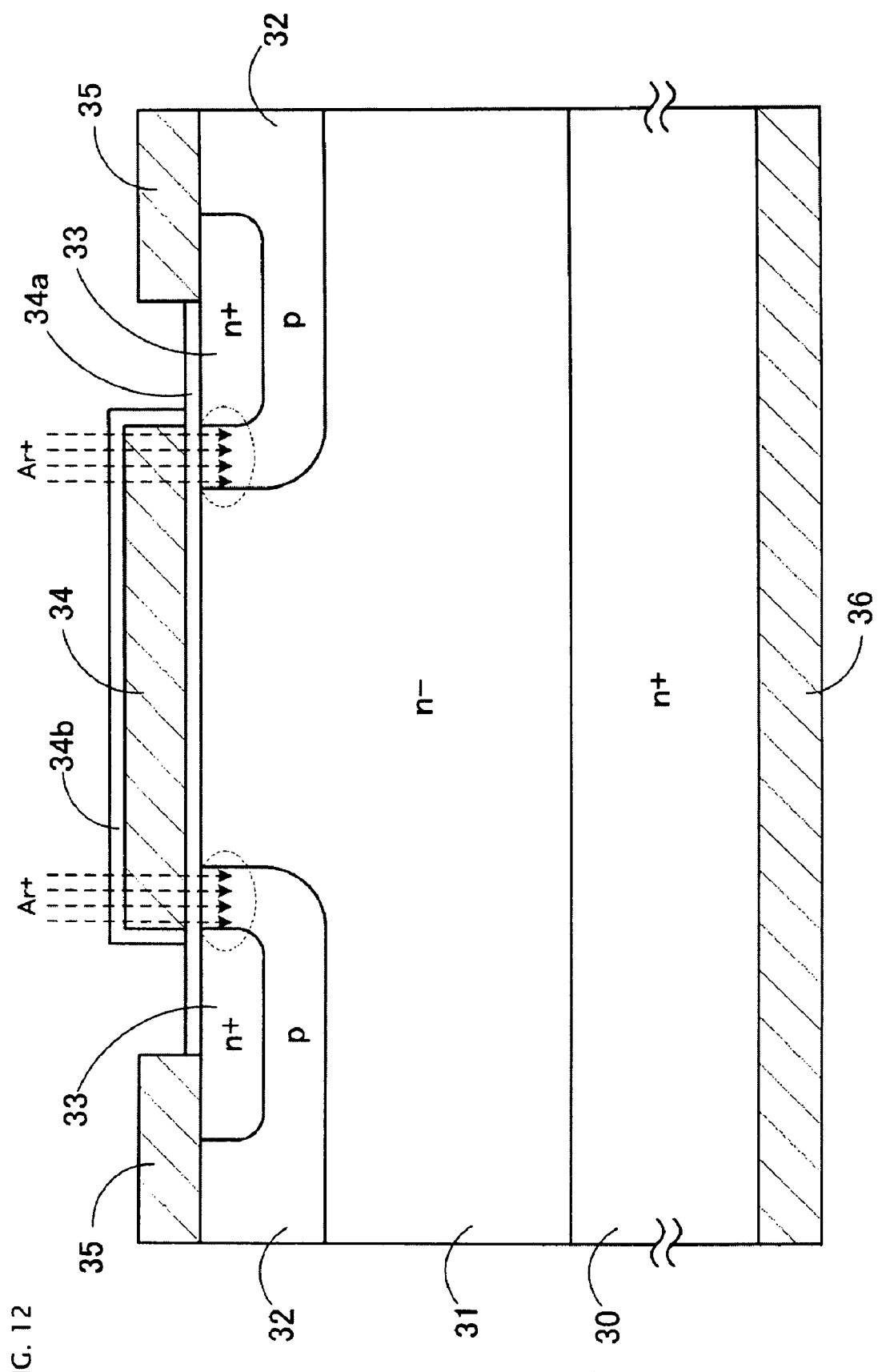
FIG. 12 is a cross sectional view of a SiC vertical DIMOSFET manufactured by the method according to a third embodiment of the invention.

Now a method of manufacturing a SiC semiconductor device according to a third embodiment of the invention will be described below. FIG. 12 is a cross sectional view of a SiC vertical DIMOSFET according to the third embodiment of the invention.

According to the third embodiment, a SiC vertical DIMOSFET is manufactured as described below. N-type drift layer 31 is formed by growing 4H-SiC epitaxial layer by thermal CVD on n-type 4H-SiC substrate 30 having an exposed (1-100) plane or an exposed (11-20) plane. The resulting n-type drift layer 31 is 5 μm in thickness and the n-type impurity concentration therein is $1\times10^{16}$ cm$^{-3}$.

Next, Ar ions are implanted in the surface portions of n-type drift layer 31 at an acceleration voltage of 30 keV and at a dose amount of $1\times10^{14}$ cm$^{-2}$~$1\times10^{15}$ cm$^{-2}$. Crystal damage caused by the ion implantation is removed by annealing at 1300° C. As a result, stress is exerted to the surface portions of n-type SiC drift layer in which Ar ions have been implanted, and the crystal lattice intervals therein are widened. The changes in the crystal lattice intervals are observed by RHEED. The implanted Ar atoms do not affect the electrical characteristics of the device.

Then, p-type base regions 32 and n-type source regions 33 are formed by implanting p-type and n-type ions into n-type drift layer 31 in the same manner as the p-type base regions and the n-type source regions in the SiC vertical DIMOSFET according to the first embodiment. Then, gate oxide film 34a, gate electrode 34, insulator film 34b, source electrodes 35, and drain electrode 36 are formed in the same manner as those in the SiC vertical DIMOSFET according to the first embodiment.

As described above, strain is introduced into surface portions of the SiC layer by Ar ion implanting and by subsequent annealing. By using the strained surface portions of the SiC layer as channel regions, the electron mobility in the channel regions is improved and the channel resistance is reduced. The SiC vertical DIMOSFET manufactured by the method according to the third embodiment exhibits the same high performance as the SiC vertical DIMOSFET manufactured by the method according to the first embodiment.

Alternatively, after changing the crystal lattice intervals in the surface portions of the SiC layer by ion implantation and subsequent annealing, another SiC layer is deposited on the distorted SiC layer by epitaxial growth, p-type base regions 32 and n-type source regions 33 are formed by ion implantation in the same manner as those in the SiC vertical DIMOSFET according to the first embodiment, and gate oxide film 34a, gate electrode 34, insulator film 3b, source electrodes 35 and drain electrode 36 are formed in the same manner as those in the SiC vertical DIMOSFET according to the first embodiment.

In manufacturing a SiC vertical DIMOSFET by the method according to the third embodiment, 6H-SiC may be used in substitution for 4H-SiC. Still alternatively, a SiC vertical DIMOSFET may be manufactured by inverting the conductivity types of the constituent layers and regions.

Figure 13:
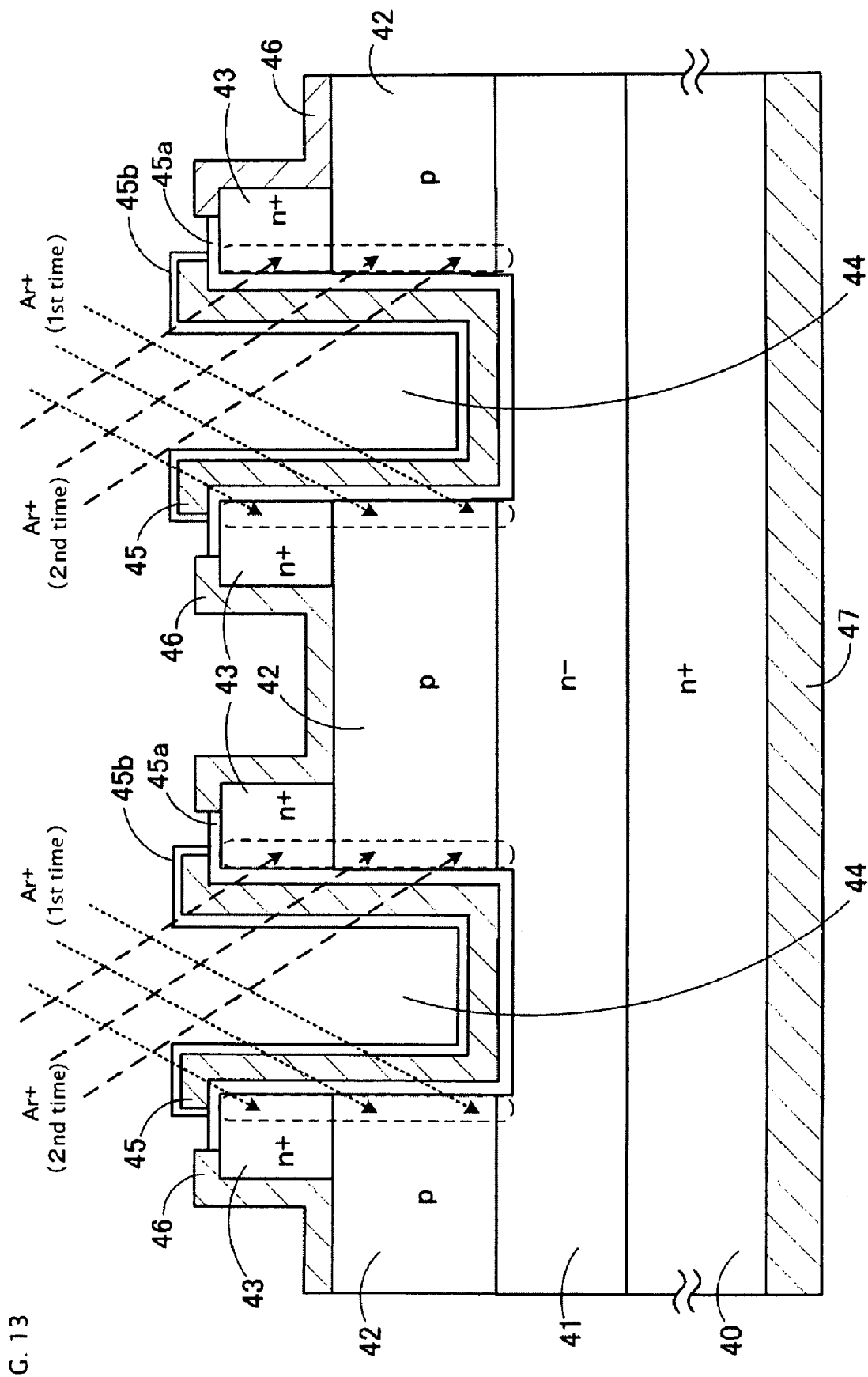
FIG. 13 is a cross sectional view of a SiC vertical UMOSFET manufactured by the method according to a fourth embodiment of the invention.

Now a method of manufacturing a SiC semiconductor device according to a fourth embodiment of the invention will be described below. FIG. 13 is a cross sectional view of a SiC vertical UMOSFET manufactured by the method according to the fourth embodiment of the invention.

N-type 4H-SiC drift layer 41 is grown in an epitaxial manner by thermal CVD on n-type 4H-SiC substrate 40 having an exposed (0001) plane. P-type 4H-SiC base layer 42 is grown in an epitaxial manner by thermal CVD on n-type drift layer 41. N-type 4H-SiC source layer 43 is grown in an epitaxial manner by thermal CVD on p-type base layer 42. The impurities and the impurity concentrations in n-type drift layer 41, p-type base layer 42, and n-type source layer 43 are the same as the respective impurities and the respective impurity concentrations in n-type drift layer 2, p-type base region 5, and n-type source region 6 in the SiC vertical DIMOSFET manufactured by the method according to the first embodiment. P-type base layer 42 and n-type source layer 43 will be p-type base regions and the n-type source regions of the SiC vertical UMOSFET according to the fourth embodiment.

Trenches 44 are etched by RIE through n-type source layer 43 and p-type base layer 42 down to n-type drift layer 41. Trench 44 seen from the side of the (0001) plane of n-type 4H-SiC substrate 40 is shaped as a stripe. The SiC laminate formed thus far is tilted at predetermined degrees of angle and Ar ions are implanted into the surface portion of the SiC layer near one side wall of each trench 44 at an acceleration voltage of 30 keV and a dose amount of $1 \times 10^{14}$ cm$^{-2}$~$1 \times 10^{15}$ cm$^{-2}$. Then, the SiC laminate formed thus far is tilted at predetermined opposite degrees of angle and Ar ions are implanted into the surface portion of the SiC layer near the other side wall of each trench 44. Then, the crystal damages caused by the ion implantation are removed by annealing at 1300° C. As a result, stress is exerted to the surface portions of the SiC drift layer near the side walls of trenches 44 and the crystal lattice intervals are widened. The changes in the crystal lattice intervals are observed by RHEED. The implanted Ar atoms do not affect the electrical characteristics of the device. Gate oxide film 45a, gate electrode 45, insulator film 45b, source electrodes 46, and drain electrode 47 are formed in the same manner as those in the SiC vertical UMOSFET according to the second embodiment.

As described above, strain is introduced into surface portions of the SiC layer near the side walls of trenches 44 by Ar ion implantation and subsequent annealing. By using the strained surface portions of the SiC layer as channel regions, the electron mobility in the channel regions is improved and the channel resistance is reduced. The SiC vertical UMOSFET manufactured by the method according to the fourth embodiment exhibits the same high performance as the SiC vertical DIMOSFET manufactured by the method according to the first embodiment.

Alternatively, after changing the crystal lattice intervals in the surface portions of the SiC layer near the side walls of the trenches by ion implantation and subsequent annealing, another SiC layer is deposited by epitaxial growth, and p-type base regions, n-type source regions, gate oxide film 45a, gate electrode 45, insulator film 45b, source electrodes 46, and drain electrode 47 are formed in the same manner as those in the UMOSFET manufactured by the method according to the second embodiment.

In manufacturing a SiC vertical UMOSFET by the method according to the fourth embodiment, 6H-SiC may be used in substitution for 4H-SiC. Still alternatively, a SiC vertical UMOSFET may be manufactured by inverting the conductivity types of the constituent layers and regions.

Figure 14:
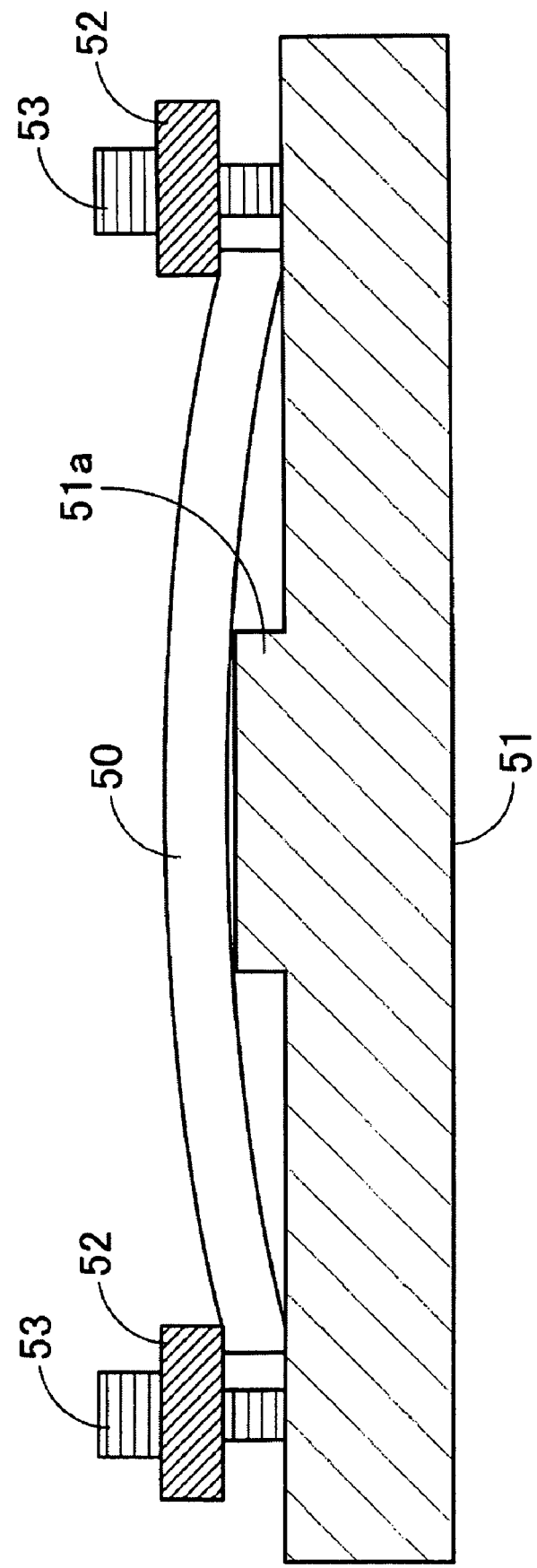
FIG. 14 is a cross sectional view describing a method of applying mechanical stress to a semiconductor device according to a fifth embodiment of the invention.
Figure 15:
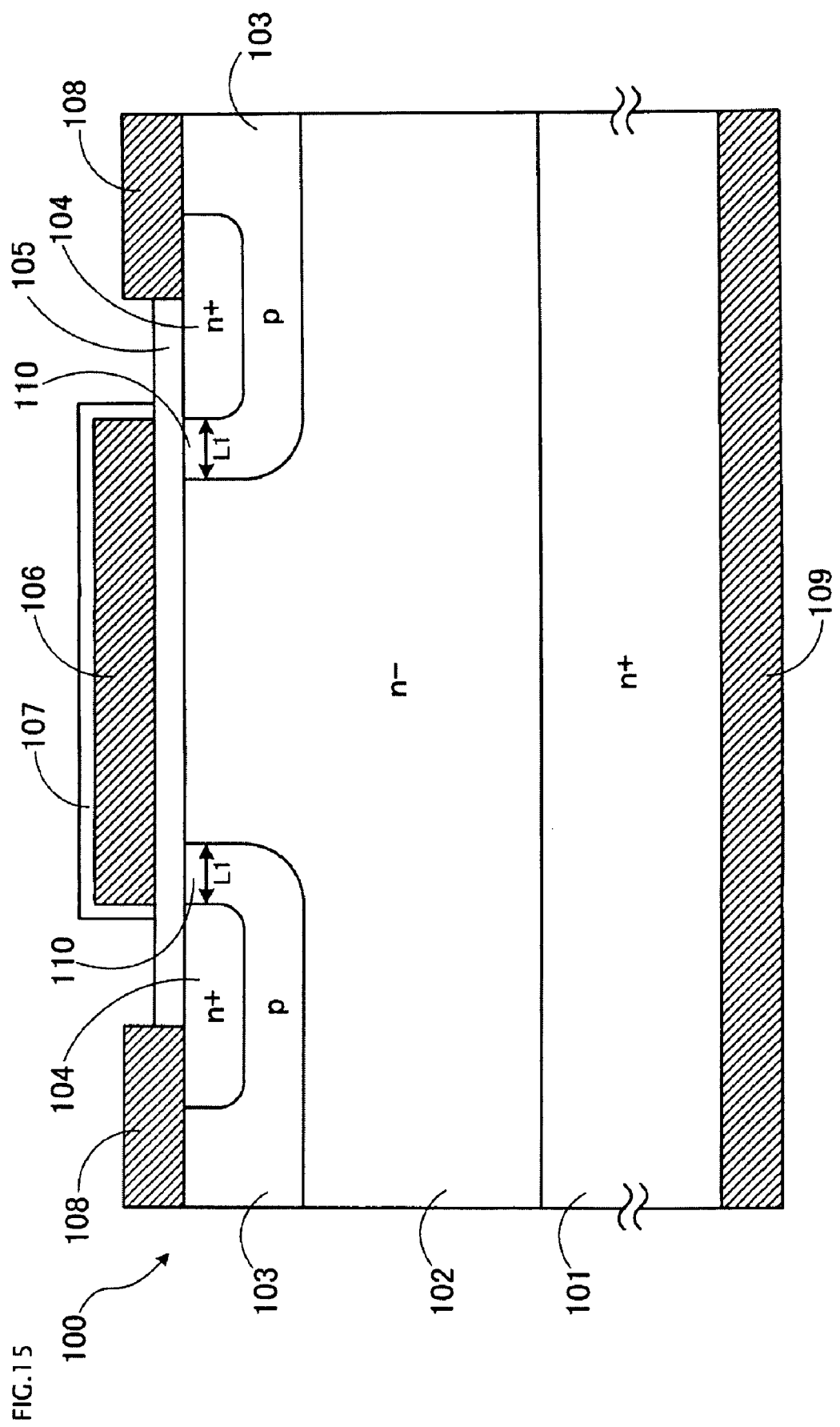
FIG. 15 is a cross sectional view of a conventional vertical DIMOSFET using SiC.
Figure 16:
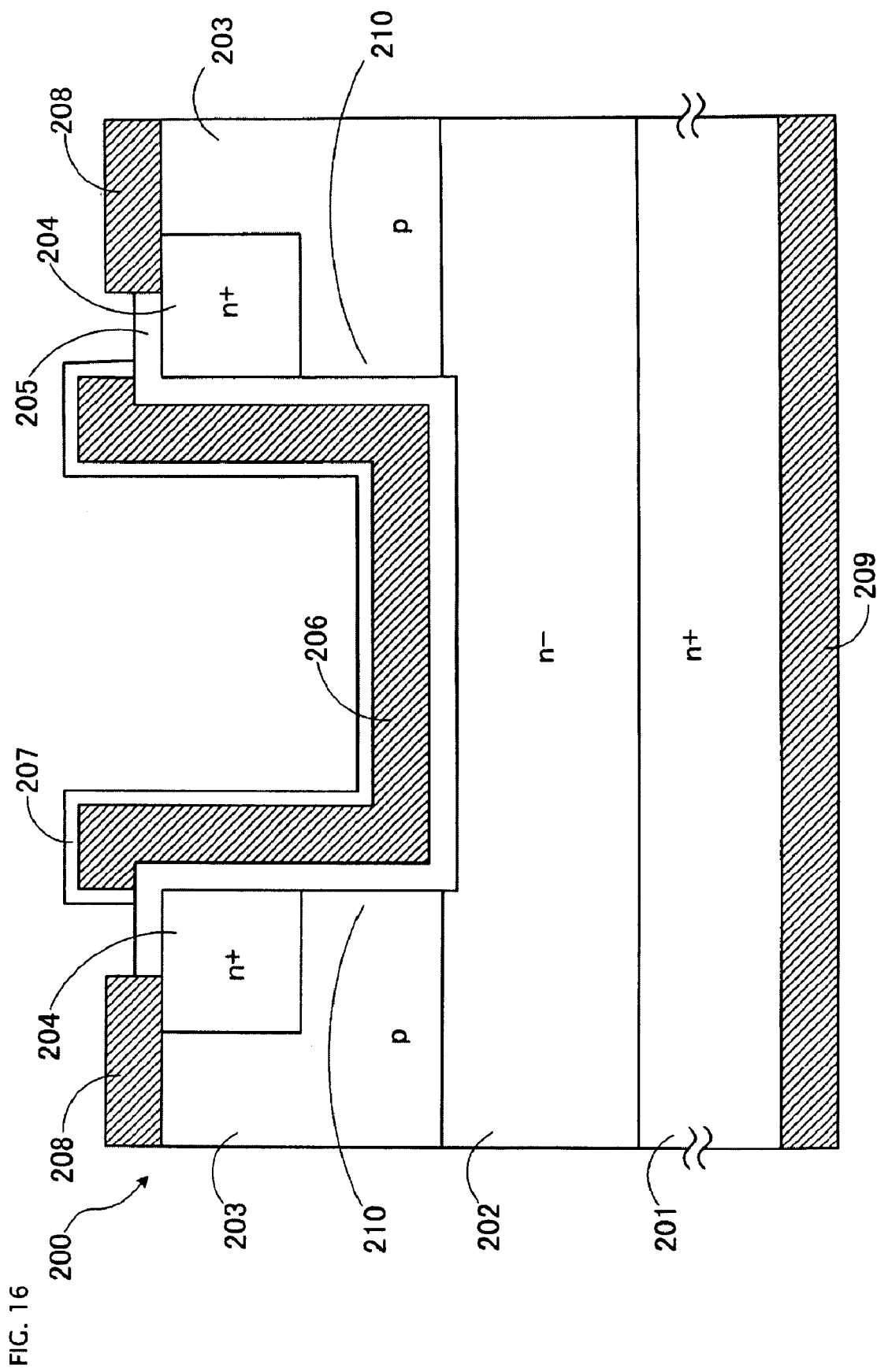
FIG. 16 is a cross sectional view of a conventional vertical UMOSFET using SiC.

Now a method of manufacturing a SiC semiconductor device according to a fifth embodiment of the invention will be described below. FIG. 14 is a cross sectional view describing a method of applying mechanical stress to a semiconductor device according to the fifth embodiment of the invention.

In FIG. 14, an installation for applying mechanical stress to a semiconductor device is shown. The installation includes metal plate 51 for mounting semiconductor device 50 thereon, jigs 52 and 52 for holding device 50, and screws 53 and 53 for fixing device 50 to jigs 52 and 52. Metal plate 51 includes convex section 51a, 10 mm×10 mm in area and 200 μm in height.

Device 50, mounting SiC vertical DIMOSFETs manufactured by the conventional method thereon and 20 mm×20 mm in area, is placed on convex section 51a such that the center of device 50 is positioned almost at the center of convex section 51a. Jigs 52 and 52 are fit to the edge portions of device 50 and the edge portions of device 50 are screwed down to metal plate 51 with jigs 52, 52 and screws 53, 53. This set up facilitates exerting mechanical stress to device 50 and changing the SiC crystal lattice intervals in the channel regions of the SiC vertical DIMOSFETs, especially the SiC crystal lattice intervals in the channel regions beneath the electrode sections in the central parts, if seen downward, of the SiC vertical DIMOSFETs.

According to the fifth embodiment, stress is exerted to the channel regions of device 50 by applying mechanical pressure thereto to cause a strain in the channel regions of device 50. By this scheme, the carrier mobility, in the channel regions is improved and the channel resistance is reduced. The SiC vertical DIMOSFET treated in the course of manufacture as described above exhibits the same high performance as the SiC vertical DIMOSFET manufactured by the method according to the first embodiment.

The height of convex section 51a, the shape of convex section 51a, and the clamping force for clamping the edge portions of device 50 are set considering the type of device 50 and the crystal lattice interval change required. In exerting stress to device 50 using the installation described above, the surface of device 50 mounting the DIMOSFET thereon may be made to face convex section 51*a* or the opposite side. By changing the side of the DIMOSFET, the kind of the stress (compressive stress or tensile stress) can be changed.

Alternatively, the device is mounted on a metal plate having a convex section and then pressed downward to the convex section so that a mechanical pressure is focused on the electrode section in the region of the device that is on the convex section of the metal plate. In yet another alternative, the central part of a SiC substrate, in which an electrode section is formed and which will be in contact with the metal plate, is raised up from the surrounding part. The SiC substrate with the central part thereof raised is mounted on a metal plate having no convex section and the edge portions of the SiC substrate are pressed to the metal plate so that a mechanical pressure is focused on the electrode section in the central part of the SiC substrate. In another alternative, the central part of a SiC substrate, in which an electrode section is formed, is made to be hollow with respect to the surrounding part. The SiC substrate having a hollow central part is mounted on a metal plate having no convex section and the central part of the SiC substrate is pressed downward to the metal plate so that a mechanical pressure is focused on the electrode section in the central part of the SiC substrate.

As described above in connection with the first through fifth embodiments of manufacturing a SiC semiconductor device, stress is exerted to the channel regions of the SiC semiconductor device by forming a SiC layer on a thin film of AlGaN, the crystal lattice constants of which are different from those of SiC, by implanting Ar ions into the SiC layer, or by forming another SiC layer on the SiC layer, into which Ar ions have been implanted. The stress exerted causes a strain in the channel regions. The strain caused improves the carrier mobility and reduces the channel resistance. By these methods, the electron mobility is improved so that it is twice as high as the electron mobility of a conventional device, and the channel resistance is reduced to half the channel resistance of a conventional device. The SiC vertical semiconductor device manufactured by the method according to any of the embodiments of the invention exhibits a low on-resistance that is close to the unipolar limit, even at a low semiconductor breakdown voltage and, therefore exhibits excellent performance.

Although the invention has been described in connection with the embodiments which improve the carrier mobility in the channel regions of the SiC semiconductor device by exerting stress to the SiC layer in which the channel regions are formed, the invention is not always limited to exerting stress to the channel region. The invention is applicable to exerting stress to the SiC layer including the region in which the carriers of the SiC semiconductor device flow.

Although the invention has been described in connection with the methods of manufacturing a DIMOSFET and a UMOSFET using SiC for the semiconductor material thereof, the manufacturing methods according to the embodiments of the invention are applicable to manufacturing a DIMOSFET and a UMOSFET using Si for the semiconductor material thereof.

Thus, an improved method of manufacturing a SiC semiconductor device has been described according to the present invention. Many modifications and variations may be made to the techniques described and illustrated herein without departing from the spirit and scope of the invention. Accordingly, it should be understood that the methods described herein are illustrative only and are not limiting upon the scope of the invention.

What is claimed is:

1. A method of manufacturing a SiC semiconductor device, the SiC semiconductor device including a SiC substrate of a first conductivity type; a SiC drift layer of the first conductivity type on the substrate; SiC base regions of a second conductivity type contacting with the drift layer; a SiC source region of the first conductivity type contacting with the base region; a gate electrode covering the portion of the base region that is sandwiched between the drift layer and the source region, with a gate insulator film interposed therebetween; a source electrode contacting commonly with the base region and the source region; and a drain electrode on the back surface of the substrate, the method comprising exerting stress to SiC in the region where carriers flow in order to change the crystal lattice intervals of the SiC by forming a nitride film comprising at least one of AlN and GaN on the sandwiched portion of the base region and forming a SiC layer comprising the region where carriers flow on the nitride film, in order to exert stress on the SiC in the region where carriers flow and thereby change the crystal lattice intervals of the SiC layer comprising the region where carriers flow.

2. The method according to claim 1, wherein said nitride film is a AlN film.

3. The method according to claim 1, wherein said nitride film is a GaN film.

4. The method according to claim 1, wherein said nitride film is a AlGaN film.

* * * * *